United States Patent [19]
Paik

[11] Patent Number: 5,590,385
[45] Date of Patent: Dec. 31, 1996

[54] MANUFACTURING METHOD OF TARGET FOR SPUTTERING

[75] Inventor: Choong-ryul Paik, Suwon, Rep. of Korea

[73] Assignee: Samsung Electronics Co., Ltd., Suwon, Rep. of Korea

[21] Appl. No.: 487,169

[22] Filed: Jun. 7, 1995

[30] Foreign Application Priority Data

Jun. 10, 1994 [KR] Rep. of Korea ............... 94-13124

[51] Int. Cl.$^6$ ................................................. B22F 1/00
[52] U.S. Cl. ........................ 419/10; 419/19; 419/33; 419/39; 419/45
[58] Field of Search ................... 419/10, 19, 32, 419/33, 39, 45

[56] References Cited

U.S. PATENT DOCUMENTS

| | | | |
|---|---|---|---|
| 4,620,872 | 11/1986 | Hijikata et al. | 75/246 |
| 4,750,932 | 6/1988 | Parent et al. | 75/228 |
| 4,915,738 | 4/1990 | Morimoto et al. | 75/246 |
| 5,098,649 | 3/1992 | Matsumoto et al. | 419/48 |
| 5,338,721 | 8/1994 | Yamamoto et al. | 505/230 |
| 5,447,801 | 9/1995 | Masuda et al. | 428/567 |

*Primary Examiner*—Charles T. Jordan
*Assistant Examiner*—Anthony R. Chi
*Attorney, Agent, or Firm*—Cushman Darby & Cushman, L.L.P.

[57] ABSTRACT

A manufacturing method of a target for sputtering comprises the steps of: compressing first and second oxide powders with high permeability to form first and second compressed materials, respectively; sintering the first and the second compressed materials to form a sintered body made of a third oxide crystal; pulverizing the sintered body made of the third oxide crystal to form a third oxide powder; mixing the third oxide powder and titanium powder and compressing the mixed powder to form a third compressed material; and sintering the third compressed material in a vacuum condition to form an oxide target. This manufacturing method produces a target which can stably form oxide thin film with high permeability at high voltage for a long time and can be applied to a direct current sputtering process.

9 Claims, 1 Drawing Sheet

MANUFACTURING METHOD OF TARGET FOR SPUTTERING

BACKGROUND OF THE INVENTION

The present invention relates to a manufacturing method of a target for sputtering, and more particularly, to a manufacturing method of a target for sputtering which can form stably an oxide thin film with high permeability for a long time at high power.

With the increased integration of DRAM memory chips, many methods have been proposed to increase capacitance within a limited cell area. These methods can be classified into three types: (1) a methods for making a dielectric film thin, (2) methods for increasing an effective area of a capacitor, and (3) methods for using a substance with a high dielectric constant.

In the first of these three methods, if the dielectric film becomes a thin film which has a thickness of less than 100Å, application to device having large capacitance is difficult because the degree of reliability is lowered by Fowler-Nordheim current.

In the second method, the capacitor should be manufactured into a three-dimensional structure to increase the effective area of the capacitor, but this complicates the manufacturing process and increases the costs thereof.

Therefore, recently, the third method which attempts to manufacture a planar type capacitor by using a substance with high permeability (for example, oxides such as $SrTiO_3$, $BaSrTiO_3$, PZT or PLZT) as a dielectric film is being actively studied.

An oxide with high permeability is deposited by metal organic chemical vapor deposition (MOCVD) or by sputtering. However, the gaseous material which is required as a precursor of MOCVD method and the process of the MOCVD method have not yet been fully developed. Therefore the oxide with high permeability is mass-produced by the sputtering method which is easier than the MOCVD method.

There are two kinds of sputtering methods for obtaining the oxide with high permeability in the form of a thin film. The first is sputtering a metal target with alloy of each constituent metal by a direct current discharge method in a reactive atmosphere, for example, of argon (Ar) and oxygen ($O_2$). The second is manufacturing an oxide target by sintering an oxide having a similar composition to an objective thin film, thereafter obtaining a thin film by a radio-frequency (RF) discharge method.

The former metal target has an advantage that the thin film can be deposited at high speed. However, since the metal target and the thin film obtained therefrom have very different composition from each other and activity of the metal (Ba, Sr, Ti, etc.) is very strong, it has a disadvantage in that it is difficult to manufacture a uniform alloy target.

On the other hand, though a small amount of reactive gas is additionally required, the latter oxide target has an advantage in that the composition between the oxide target and the thin film obtained therefrom is almost the same and it is not difficult to manufacture the target.

However, the oxide target should be sputtered by the RF method because the oxide target generally has high electrical resistance. Also, the surface temperature of a target is increased by an incident energy of $Ar^+$ ions during the sputtering process; that is, the temperature of the target is considerably increased even at a low applied power during the sputtering process because an oxide or a ceramic target has a lower thermal conductivity than a metal target and therefore the cooling efficiency is degraded.

When the temperature of the target is increased by sputtering as described above, the target's volume is expanded by thermal expansion, thereby causing a tensile stress.

The oxide or ceramic target has a higher strength than a metal material against a compression stress but has a very poor tensile stress. Therefore, the oxide or ceramic target cannot be stably discharged for a long time at high applied power, as damage may occur even at a low applied power.

Therefore, to form an oxide thin film with high permeability without destroying the target, the target should be sputtered with a low applied power. This causes a poor deposition rate of the oxide thin film, which is a serious disadvantage in that it makes mass-production difficult.

SUMMARY OF THE INVENTION

The object of the present invention is to provide a manufacturing method of a target for sputtering which can stably form an oxide thin film with high permeability even when subjected to sputtering for a long time at high power.

The manufacturing method of a target for sputtering comprises the steps of: compressing first and second oxide powder with high permeability to form first and second compressed material, respectively; sintering the first and the second compressed material to form sintered body made of third oxide crystal; pulverizing the sintered body made of the third oxide crystal to form third oxide powder; mixing the third oxide powder and titanium powder and compressing the mixed powder to form third compressed material; and sintering the third compressed material in a vacuum condition to form an oxide target.

It is preferable that the step for forming the oxide powder is carried out in an inert atmosphere, alcohol or nucleic acid, wherein the inert atmosphere is preferably argon or nitrogen atmosphere.

It is preferable that the first oxide powder is $SrCO_3$ and the second oxide powder is $BaCO_3$.

It is preferable that the third oxide powder is $(Ba_{0.5}Sr_{0.5})O$.

It is preferable that the first and the second oxide powders with high permeability are selected from a group consisting of $SrTiO_3$, $Ba_xSr_{1-x}TiO_3$, $SrCO_3$ and $BaCO_3$.

It is preferable that the oxide target is formed into a structure such that the third oxide crystal is surrounded by titanium in a grain boundary phase.

According to the manufacturing method of the target for sputtering of the present invention, an oxide thin film with high permeability can be stably formed even when sputtering is performed for a long time at a high applied power.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
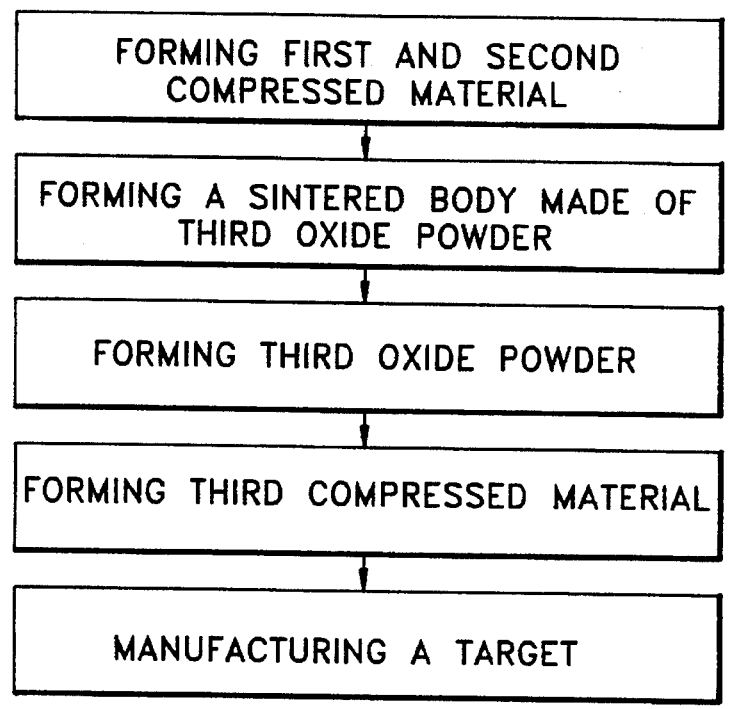
FIG. 1 is a flow chart for explaining a manufacturing method of a target for sputtering of the present invention.

FIG. 1 is a flow chart for explaining a manufacturing method of a target for sputtering of the present invention.

A manufacturing method of a target for sputtering of this invention comprises the steps of: compressing first and second oxide powder with high permeability to form first and second compressed materials, respectively; sintering the first and the second compressed materials to form a sintered body made of third oxide; pulverizing the sintered body made of the third oxide to form third oxide powder; mixing the third oxide powder and a titanium powder and compressing the mixed powder to form a third compressed material; and sintering the third compressed material in a vacuum condition to form a target.

The first and the second oxide powders can be selected from the group consisting of $SrTiO_3$, $Ba_xSr_{1-x}TiO_3$, $SrCO_3$ and $BaCO_3$.

As the first and second oxide with high permeability, $BaCO_3$ and $SrCO_3$ with a particle diameter of about 1 μm are compressed at a predetermined pressure to prepare the first and the second compressed materials, respectively.

$$BaCO_3 + SrCO_3 \rightarrow BaO + SrO + 2CO_2 \uparrow \qquad (1)$$

Referring to the reaction formula (1), if $BaCO_3$ and $SrCO_3$ are compressed at a temperature of not less than 700° C., $CO_2$ is eliminated to produce the first compressed material of BaO and the second compressed material of SrO.

Thereafter, the first and second compressed material are sintered at a high temperature (e.g., not less than 1,200° C.) to produce a sintered body made of the third oxide.

$$BaO + SrO \rightarrow (Ba_{0.5}Sr_{0.5})O \qquad (2)$$

Referring to the reaction formula (2), when the first and second compressed material are sintered at a temperature of not less than 1,200° C., the sintered body made of the third oxide of $(Ba_{0.5}Sr_{0.5})O$ is produced.

Then, the sintered body is pulverized to produce the third oxide powder of $(Ba_{0.5}Sr_{0.5})O$ with a particle diameter of about 5–10 μm. It is preferable that the pulverization process is carried out in an inactive atmosphere, such as an argon and nitrogen atmosphere, alcohol or nucleic acid. If the pulverization process is carried out in the air, the $(Ba_{0.5}Sr_{0.5})O$ powder absorbs the moisture and carbon dioxide gas in the air, and a sintering property of the powder in the following sintering process is impeded.

Next, the $(Ba_{0.5}Sr_{0.5})O$ powder and the titanium powder with a particle diameter of about 2–3 μm are mixed and compressed to produce the third compressed material.

The third compressed material is then placed in a vacuum chamber having a pressure of not more than $1 \times 10^{-5}$ Torr, and sintered at a temperature of not less than 1,000° C. to manufacture the target.

$$(Ba_{0.5}Sr_{0.5})O + Ti \rightarrow (Ba_{0.5}Sr_{0.5})O + (BaSr)TiO_x + Ti \qquad (3)$$

The sintering process in the vacuum atmosphere is carried out according to the reaction formula (3). In this reaction, $(BaSr)TiO_x$ produced by reacting $(Ba_{0.5}Sr_{0.5})O$ and Ti is a phase which surrounds the crystal of $(Ba_{0.5}Sr_{0.5})O$, and Ti is the boundary phase. Since the titanium has a faster diffusion speed than $(Ba_{0.5}Sr_{0.5})O$, the titanium exists in the grain boundary phase and increases the density of the target.

A conventional target invention is more simply manufactured than that of the present invention because it is manufactured by using $(Ba_{0.5}Sr_{0.5})TiO_3$, which is produced by mixing and sintering $BaTiO_2$ with $SrTiO_3$. However, the conventional target of has a disadvantage in that it is easily damaged even at a low applied power because the tensile stress thereof is considerably weak.

On the contrary, a target of the present invention has an improved durability against destruction because it is structured so that the crystal of $(Ba_{0.5}Sr_{0.5})O$ is surrounded by the titanium, the tensile strength of which is strong in the grain boundary phase.

Also, since the titanium composing the target is structured as a grain boundary phase, direct current discharge sputtering can be carried out. That is, if a small amount of oxygen gas ($O_2$) is added when the sputtering is carried out by using the target having the composition of $(Ba_{0.5}Sr_{0.5})TiO_{3-x}$ of the present invention, the oxide thin film composed of $(Ba_{0.5}Sr_{0.5})TiO_3$ according to the conventional method can be prepared.

Figure 2:
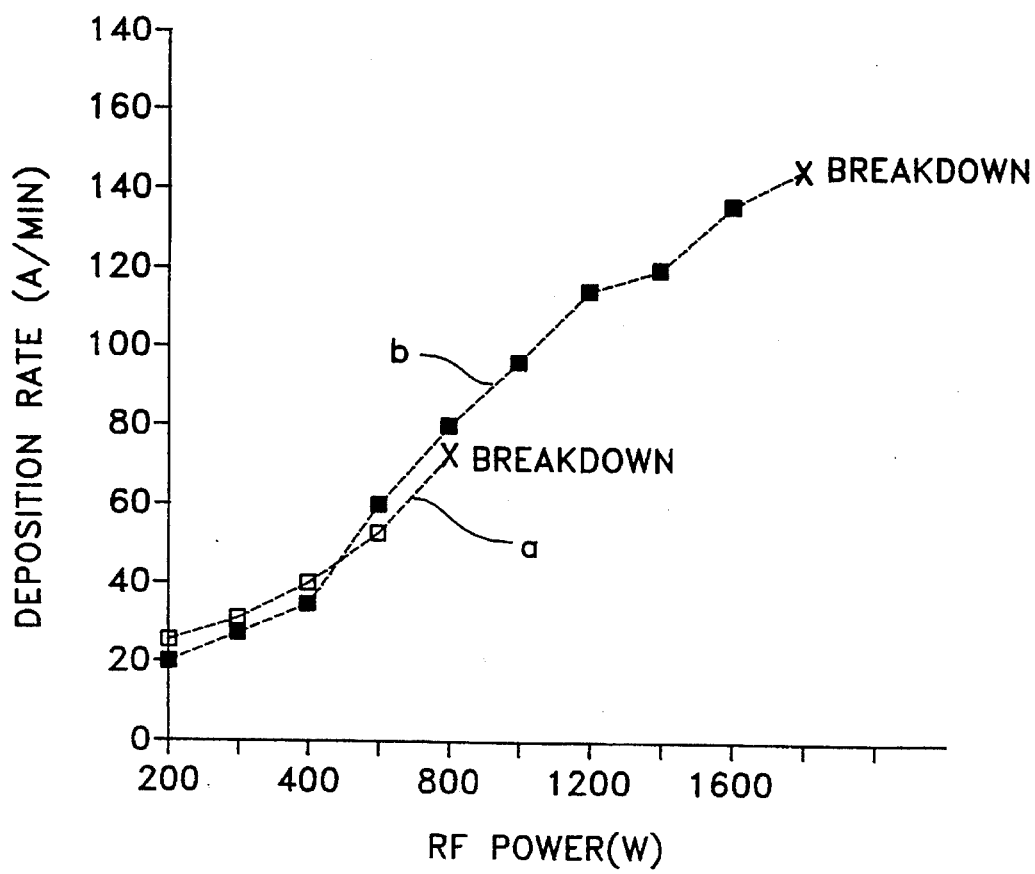
FIG. 2 is a graphical view for comparing the sputtering of each target, by the conventional method and the method of the present invention, while changing the applied power.

FIG. 2 is a graphical view for comparing the sputtering of each target, manufactured by the conventional method and by method of the present invention, while changing the applied power.

Referring to FIG. 2, the target for sputtering of the conventional method (a) experiences no surface changes when the applied power is increased to 700W, but, at an applied power of 800W, surface cracking and partial damage to the target occurs.

On the other hand, the target for sputtering of the present invention (b) has no changes on its surface even when the applied power is increased to 1,600W. However, cratering does appear on the surface of the target at an applied power of 1,800W. Here, the formation of these crater-type holes seems to result from destruction of the crystal of $(Ba_{0.5}Sr_{0.5})O$ due to a tensile stress.

According to the present invention described, $(Ba_{0.5}Sr_{0.5})O$ powder is sintered together with titanium powder to manufacture the target, thereby improving the durability of the target. Therefore, the oxide thin film with high permeability is stably formed at the high applied power. Also, the target has an improved deposition rate as compared with the target of the conventional method because the target of this invention can be sputtered by the direct current discharge.

As a result, the target for sputtering of the present invention can be sputtered at an applied power of not less than twice that of the conventional target.

The present invention is not limited to the above embodiment and many modifications are available to those skilled in this art.

What is claimed is:

1. A manufacturing method of a target for sputtering comprising the steps of:

compressing first and second oxide powders with high permeability to form first and second compressed materials, respectively;

sintering said first and said second compressed materials to form a sintered body made of third oxide crystal;

pulverizing said sintered body made of said third oxide crystal to form a third oxide powder;

mixing said third oxide powder and titanium powder and compressing the mixed powder to form a third compressed material; and sintering said third compressed material in a vacuum condition to form an oxide target.

2. A manufacturing method of a target for sputtering according to claim 1, wherein said pulverizing is carried out in one of an inert atmosphere, alcohol and nucleic acid.

3. A manufacturing method of a target for sputtering according to claim 2, wherein said inert atmosphere is one of argon and nitrogen atmosphere.

4. A manufacturing method of a target for sputtering according to claim 1, wherein said first oxide powder is $SrCO_3$ and said second oxide powder is $BaCO_3$.

5. A manufacturing method of a target for sputtering according to claim 1, wherein said third oxide crystal is $(Ba_{0.5}Sr_{0.5})O$.

6. A manufacturing method of a target for sputtering according to claim 4, wherein said third oxide crystal is $(Ba_{0.5}Sr_{0.5})O$.

7. A manufacturing method of a target for sputtering according to claim 1, wherein said first and said second oxide powders with high permeability are selected from the group consisting of $SrTiO_3$, $Ba_xSr_{1-x}TiO_3$, $SrCO_3$ and $BaCO_3$.

8. A manufacturing method of a target for sputtering according to claim 1, wherein said oxide target is formed into a structure in which said third oxide crystal is surrounded by titanium in a grain boundary phase.

9. A manufacturing method of a target for sputtering according to claim 1, wherein said first and second oxide powders are compressed such that $CO_2$ is eliminated.

* * * * *